United States Patent [19]

Dyson et al.

[11] Patent Number: 4,858,233
[45] Date of Patent: Aug. 15, 1989

[54] REDUNDANCY SCHEME FOR MULTI-STAGE APPARATUS

[75] Inventors: Clive M. Dyson, Yate; Anthony D. King-Smith, Dursley; Mohamad H. Yassate, Portishead, all of England

[73] Assignee: INMOS Limited, Bristol, United Kingdom

[21] Appl. No.: 52,250

[22] Filed: May 19, 1987

[30] Foreign Application Priority Data

May 22, 1986 [GB] United Kingdom ............... 8612454

[51] Int. Cl.⁴ .............................................. G06F 11/20
[52] U.S. Cl. ........................................ 371/9; 364/737
[58] Field of Search ................. 371/9, 11; 364/200, 364/900, 737; 365/200

[56] References Cited

U.S. PATENT DOCUMENTS

| | | | |
|---|---|---|---|
| 3,805,039 | 4/1974 | Stiffler | 371/8 |
| 4,245,343 | 1/1981 | Frey | 371/11 |
| 4,314,349 | 2/1982 | Batcher | 371/9 X |
| 4,566,102 | 1/1986 | Hefner | 371/11 |
| 4,584,682 | 4/1986 | Shah et al. | 371/11 X |
| 4,713,811 | 12/1987 | Frey | 371/9 |
| 4,720,817 | 1/1988 | Childers | 365/200 |
| 4,722,084 | 1/1988 | Morton | 371/9 |
| 4,723,241 | 2/1988 | Grobel et al. | 371/11 |

FOREIGN PATENT DOCUMENTS

| | | |
|---|---|---|
| WO84/4225 | 10/1984 | PCT Int'l Appl. . |
| 1543109 | 3/1979 | United Kingdom . |
| 2074351 | 10/1981 | United Kingdom . |
| 2114782 | 8/1983 | United Kingdom . |
| 2121996 | 1/1984 | United Kingdom . |

Primary Examiner—Charles E. Atkinson
Attorney, Agent, or Firm—Edward D. Manzo

[57] ABSTRACT

A multi-stage apparatus has an input which is coupled to an output by way of a plurality of first stages. The stages are sequentially coupled together to form a chain. A spare stage, which is substantially identical to at least a selected one of said first stages is also provided. The apparatus also includes programmable logic means arranged to uncouple said selected first stage from said chain and to couple said spare stage into said chain such that the input remains coupled to the output by the same number of stages. In this way a redundancy scheme for the multi-stage apparatus is implemented.

22 Claims, 4 Drawing Sheets

REDUNDANCY SCHEME FOR MULTI-STAGE APPARATUS

BACKGROUND TO THE INVENTION

The present invention relates to multi-stage apparatus and to a method of replacing a selected stage of such an apparatus with a spare stage.

If a multi-stage circuit, for example, a digital signal processing circuit, is fabricated on a single chip, the manufacturing yield can be increased if a redundancy scheme for the circuit can also be incorporated on the chip. Such a scheme would provide replacements for one or more stages found to be faulty.

SUMMARY OF THE INVENTION

The present invention provides a redundancy scheme for a multi-stage apparatus. An apparatus embodying aspects of the present invention has an input and an output. A plurality of first stages are sequentially coupled together to form a chain for coupling the input to the output. The apparatus includes a spare stage which is substantially identical to at least a selected one of the first stages. Logic circuitry cooperates with coupling circuitry and address decoding circuitry, and is programmable to uncouple a selected first stage from chain and to couple the spare stage into the chain such that the input remains coupled to the output by the same number of stages. Preferably, the logic circuitry can bypass the selected first stage.

In an embodiment, each first stage has one or more input terminals and one or more output terminals. The output terminals of each first stage are coupled to the input terminals of the next stage in succession. Bypassing circuitry is arranged to connect the input terminals of the selected first stage directly to the output terminals of the same first stage. The bypassing circuitry may include a first switch actuable by the logic circuitry to connect the input and output terminals of the first stage selected for decoupling or bypassing. Preferably, the bypassing circuitry further includes a second switch actuable by the logic to isolate the selected first stage when the input and output terminals thereof are connected by said bypassing circuit.

The first stages are generally all substantially identical, and in the preferred embodiment the logic has a respective logic circuit associated with each of the first stages. Thus, in accordance with the prior paragraph, each logic circuit includes a first programmable switch actuable to bypass the respective first stage, and a second programmable switch actuable to isolate the respective first stage.

Generally, the number of input terminals of each first stage is equal to the number of output terminals of the same first stage.

In an embodiment, each of the first stages is accessible by a respective one of a plurality of decoders. Each decoder is associated with a respective stage, and logic to enable each decoder to access its respective first stage. The logic is also actuable to isolate the selected first stage from its associated decoder.

Thus, the logic couples the decoder isolated from the selected first stage to access either the spare stage or a further one of the first stages. When the isolated decoder is coupled to access a further one of the first stages, the logic then selectively isolates further first stages from their associated decoders and concurrently couples the decoders so isolated to access the further first stages and spare stage. Each of the decoders is coupled to individually access a single respective one of the first and spare stages, except the selected first stage.

The present invention also extends to a method of replacing a selected stage of a multi-stage apparatus with a spare stage, wherein the apparatus has an input and an output, and comprises a plurality of first stages sequentially coupled together to form a chain for coupling the input to the output, and a spare stage which is substantially identical to at least a selected one of said first stages. The method comprises the steps of uncoupling a selected first stage from the chain and coupling the spare stage into the chain such that the input remains coupled to the output by the same number of stages.

In an embodiment, each of a plurality of decoders for enabling access to the stages are associated with a respective first stage. The method further comprises the steps of isolating the bypassed first stage from its associated decoder and coupling the isolated decoder to access either said spare stage or a further one of the first stages. When the isolated decoder is coupled to access a further one of the first stages, the method selectively isolates further first stages from their associated decoders and concurrently couples the decoders so isolated to access the further first stages and said spare stage such that the spare stage and each of the first stages, except the bypassed first stage, are each coupled to be individually accessed by a single respective decoder.

BRIEF DESCRIPTION OF THE DRAWINGS

An embodiment of the present invention will hereafter be described, by way of example, with reference to the accompanying drawings in which.

DESCRIPTION OF PREFERRED EMBODIMENT

Figure 1:
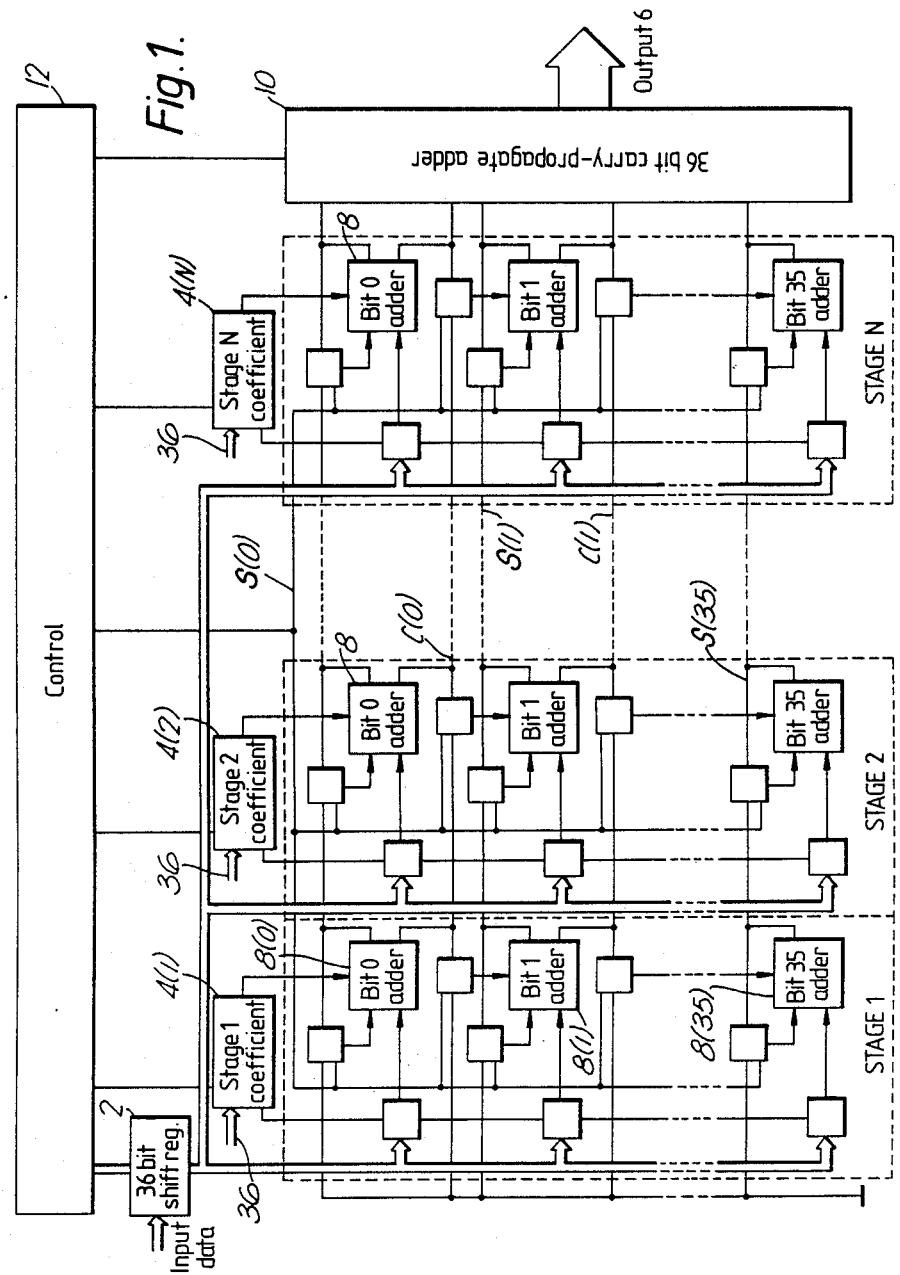
FIG. 1 shows schematically a multi-stage digital signal processing circuit.

The circuit shown in FIG. 1 is a multi-stage digital signal processing circuit arranged to perform multiplications and additions on data fed thereto. The output of the circuit of FIG. 1 at time t=kT is given by:

$$f(kT) = w(1)* x[kT] + w(2)*x[(k-1)T] + \ldots + w(N)*x[(k-N+1)T]$$

In this respect, the input data x is a function which varies with time and is fed in common by way of a 36 bit shift register 2 to each of the N stages of the circuit of FIG. 1. In the above equation, x[kT] represents the kth input data sample. The coefficient w(1) is fed to a coefficient control unit 4(1) in the first stage, and similarly an appropriate coefficient is fed to a respective coefficient control unit associated with each stage of the circuit, for example, the coefficient unit 4(2) of the second stage receiving the coefficient w(2) and the coefficient unit 4(N) of the final Nth stage receiving the coefficient w(N). At any one time interval T, each stage of the circuit of FIG. 1 is controlled to multiply the two digital signals fed thereto by a series of additions. It will be appreciated that the stages of the circuit are connected in succession to form a chain, the output of each stage being connected to the input of the succeeding stage. Thus, the products computed by each stage are fed along the chain so that these products are all added together to produce the required function f(kT) at the output 6.

It will be apparent from FIG. 1 that, in each stage the multiplication is performed on a bit by bit basis. Thus, in each stage there is an individual adder circuit 8 for each bit of the input data, the least significant bit thereof being fed to a bit 0 adder 8(0), the next significant bit being fed to a bit 1 adder 8(1) and so on, the most significant bit being fed to a bit 35 adder 8(35).

The coefficient w(1), w(2) ... w(N) in each coefficient control unit 4(1), 4(2) ... 4(N) is arranged to be fed on a bit by bit basis, with the least significant bit first, to the associated stage, so that the desired product can be computed. Preferably, the coefficient control units 4 include memory locations such as shift registers.

Figure 3:
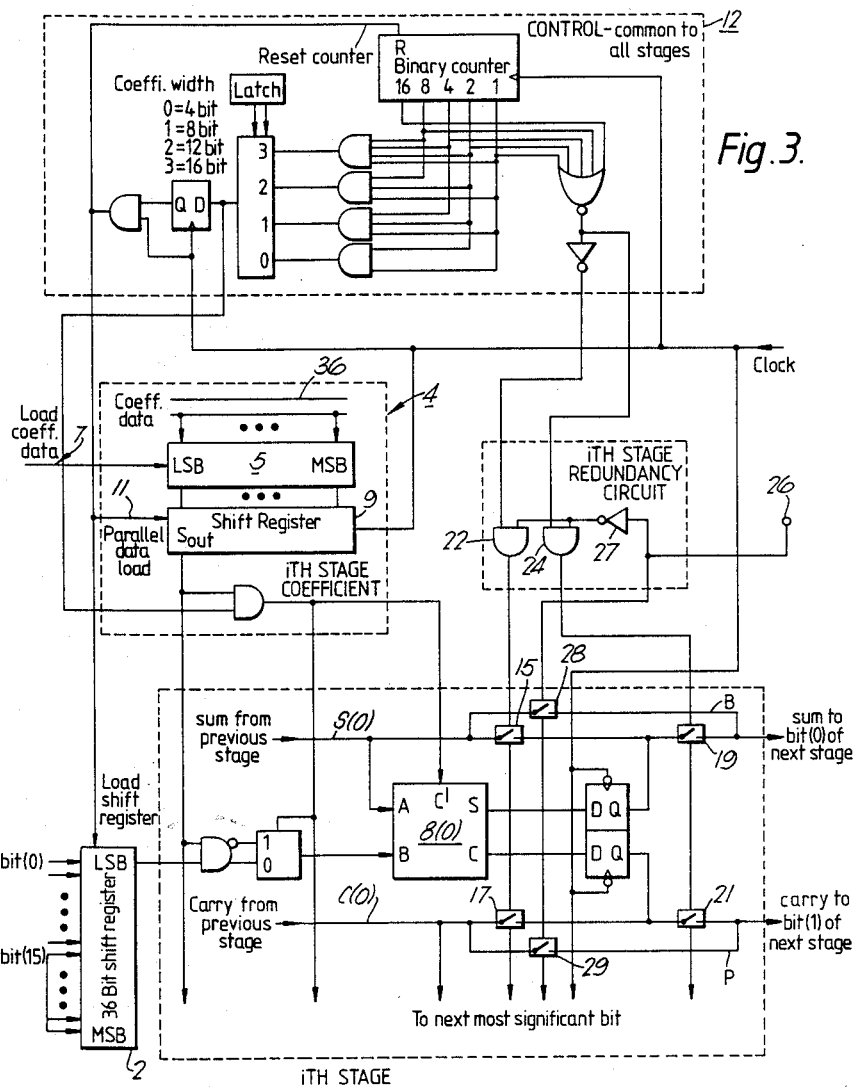
FIG. 3 shows in more detail the control and part of one stage of the circuit of FIG. 1.

Each of the adders 8(0) to 8(35) of each stage, is a full adder circuit having two data inputs A and B, a carry in input C' and sum and carry outputs S and C as can be most clearly seen from FIG. 3.

The multiplication in each stage is performed by repeated additions and in this respect, each sum output S can be fed back to the A input by appropriate gates whereas the carry output C can be fed to the carry in C' input of the next full adder circuit in the same stage. Multiplication by repeated use of full adders in this manner is known and in not described further herein.

In the circuit shown in FIG. 1 it is not intended to fully resolve the carries produced by the adders 8 in each stage before passing the product of that stage to the next succeeding stage. Thus, the circuit shown in FIG. 1 is controlled, by means of a control unit and clock circuit 12, such that periodically the data appearing at the sum and carry outputs S and C of each of the adders of a stage is transferred to the next stage. This data can then be added to the product being computed in that next stage.

The sum and carry outputs S and C of the individual adders 8 of the last stage N are fed to a 36 bit carry-propagate adder 10 which adds the data received with full resolution of any carry signals generated and thus feeds the function f(kT) to the output 6. The function of the circuit shown in FIG. 1 and the manner in which it performs this function is not described further. Circuits similar to that shown in FIG. 1 are illustrated and described in our copending British application No. 8612453 filed on the same date as this application and entitled "Improvements in or relating to multistage digital signal multiplication and addition, and the disclosure in that copending application is incorporated herein by reference.

FIG. 1 is included herein simply as an example of a multi-stage circuit in which each stage is an active device, and where the stages are coupled to form a chain connecting a data input of the circuit to a data output. The stages of the chain are all substantially identical, and each stage can be individually addressed such that individually selected data can be fed to each stage. Thus, in the circuit shown in FIG. 1, a respective coefficient is received in the coefficient unit 4 associated with the respective stage.

It is envisaged that a multi-stage circuit such as shown in FIG. 1 would be fabricated on a single integrated circuit chip and to make the circuit tolerant of defects, the present invention provides a redundancy scheme for such a circuit. The redundancy scheme is implemented by including in a circuit such as shown in FIG. 1 at least one spare stage (not shown) which is substantially identical to each of the stages already provided. Thus, if one of the stages of the circuit of FIG. 1 is found to be faulty it can be replaced by the spare stage. This is achieved by bypassing the faulty stage, such that it becomes "transparent" to the data passing along the chain from the input to the output, and by suitably reordering the rest of the chain to include the spare stage.

Figure 2:
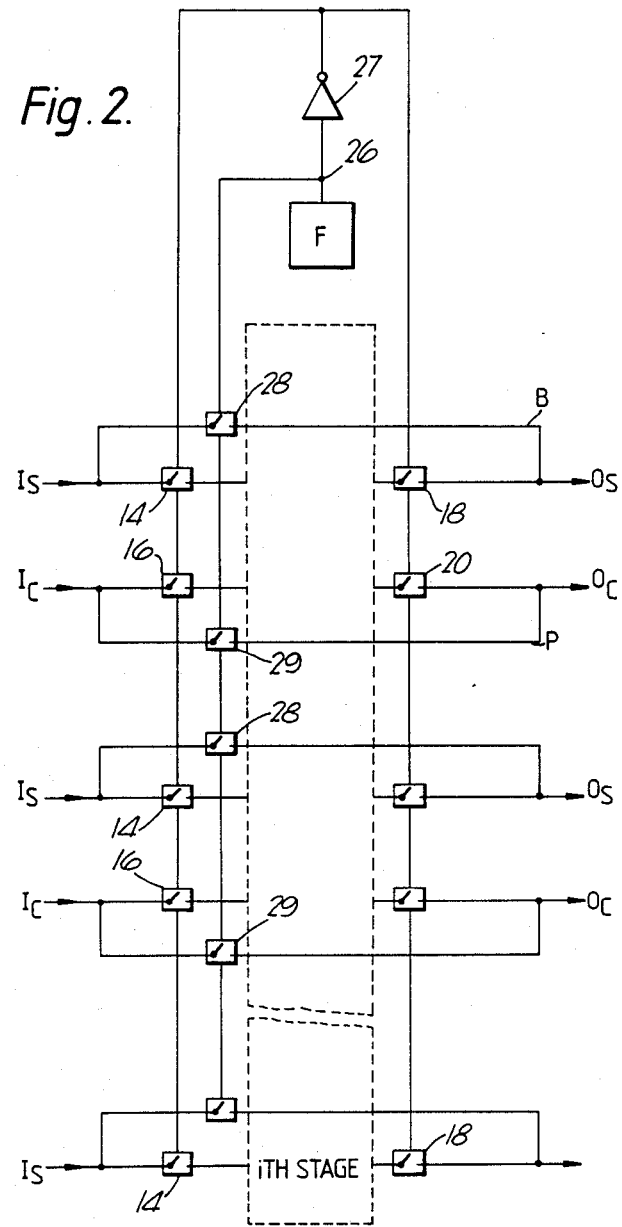
FIG. 2 shows schematically one stage of a generalised multi-stage circuit to illustrate how this one stage can be bypassed.

The manner in which a faulty stage can be bypassed is illustrated by FIGS. 2 and 3.

FIG. 2 shows schematically a representative stage of a generalised multi-stage circuit showing the connection of this stage to the preceding and following stages.

Each stage of the circuit of FIG. 2 has a number of input lines Is and Ic and a number of output lines Os and Oc. Each of the input lines Is, Ic is controlled by a respective switch 14, 16 and each of the output lines Os, Oc is similarly controlled by a respective switch 18, 20. Normally, the switches 14, 16, 18 and 20 are closed such that data on the input lines Is and Ic is fed into the stage for processing thereby and such that the results of this processing are output on the output lines Os and Oc.

As is shown in FIG. 2, each of the switches 14, 16, 18 and 20 is connected by way of an inverter 27 to a node 26 whose voltage is determined by a fault indicating circuit F. In the embodiment illustrated this fault indicating circuit F is arranged to produce a low voltage output when there is no fault in the representative stage and a high voltage output when there is such a fault. In the circuits illustrated, a low voltage, for example 0 volts, is set to represent a logical "zero" whereas a high voltage output, for example 5 volts, is set to represent a logical "one".

Thus, if there is no fault in the stage, the fault circuit F is arranged to produce a zero signal on the node 26 and this is connected via the inverter 27 to each of the switches 14, 16, 18 and 20. Each switch thus has a one applied thereto. It is arranged that a one applied to any of the switches 14, 16, 18, 20 will render that switch, which may be a transistor, conductive.

If the stage is faulty, the fault circuit F is set to produce a one signal at the node 26. This one is applied via the inverter 27 to the switches 14, 16, 18 and 20, such that a zero is applied to each said switch to render the switch non conductive. These switches remain off whilst there is a one signal at the node 26.

It can be seen from FIG. 2 that the illustrated stage can be bypassed by shorting each input line Is and Ic to an output line Os and Oc. In the embodiment illustrated, a respective bypass line B is provided to couple each input line Is to a corresponding output line Os by operation of a respective switch 28. Similarly, each input line Ic can be shorted to an associated output line Oc by a respective bypass line P controlled by a respective switch 29. Each of the switches 28 and 29 is connected to be controlled by the signal at the node 26.

When the signal at node 26 is zero, indicating that there is no fault in the stage, a zero signal is applied to each of the switches 28 and 29 which are thereby rendered non conductive such that the bypass lines B and P are all open circuit. The signals fed along the input lines Is and Ic are therefore fed into the stage, and the stage output is fed onto the output lines Os and Oc. However, when a fault in the stage is indicated by the presence of a one signal at node 26, the switches 28 and 29 are all rendered conductive such that the bypass lines B and P each provide a short circuit path between respective input and output lines. Thus, the data on the input side of the stage is shorted to the output side thereof. The stage therefore becomes "transparent" to the data. Because the switches 14,16,18 and 20 are also held off, by the one signal at the node 26 which is inverted by the inverter 27, these switches act to completely isolate the stage from the input and output lines.

FIG. 3 shows the control unit and clock circuit 12 and part of one stage of the circuit of FIG. 1 in some detail. In particular, FIG. 3 shows, for a representative ith stage, the full adder 8(0) of the least significant bit and the associated circuitry. The data input to the ith stage is shown as an individual shift register 2 and the coefficient control unit 4 associated with the ith stage is also shown. The coefficient control unit 4 includes a memory store 5 arranged to receive the coefficient for this stage from a data path 36 or other memory location. Loading of the coefficient into the memory store 5 is controlled by a control signal on line 7. Subsequently, the coefficient in memory store 5 can be loaded into a shift register 9 under the control of a control signal on a line 11.

As is described above each adder 8 for each bit position within a stage is connected to receive a sum and a carry signal from the preceding stage and to output a sum and carry signal to the next stage. Thus, associated with each bit position extending through each stage from its input to its output is a sum line S and a carry line C. Thus, as shown in FIGS. 1 and 3, the sum line S(0) and the carry line C(0) are associated with the outputs at the least significant bit position, the sum line S(1) and the carry line C(1) are associated with the outputs of the next significant bit position, and so on. At the output to each stage there are gating means 15, 19, each associated with a respective sum line and gating means 17 and 21 each associated with a respective carry line. As it will be seen from FIG. 1, there is no carry line associated with the output of the most significant bit position. These gating means can be switches as indicated in FIG. 3.

As indicated above, the circuit is controlled such that the data in each stage is transferred at an appropriate time to the next following stage. The transfer of the data from stage to stage is controlled by switches 19 and 21. Thus, if the switches 15 and 17 are on data produced by the stage can be fed back to its own input. Subsequently, switching the switches 19 and 21 on enables the products from the ith stage to be fed forward to the next stage. The switches 15, 17, 19 and 21 are controlled by the control circuit 12 which is common to all the stages.

The switches 15,17,19 and 21 are controlled to determine the operation of the ith stage, and in particular, to control the transfer of data from its input to its output. A bypass scheme for this ith stage of the general type illustrated in FIG. 2 can be very simply implemented by using the already provided switches 15,17,19 and 21 to perform a second function akin to that performed by the switches 14,16,18 and 20 of the arrangement of FIG. 2. In this respect, each of the switches 15 and 17 of the ith stage is connected to the control circuit 12 by way of an AND gate 22, one input of which is connected to the control circuit 12. Similarly, the switches 19 and 21 of the ith stage are connected to the control 12 by means of a further AND gate 24. The second input of each AND gate is connected by way of the inverter 27 to the node 26 whose voltage is determined by the fault indicating circuit F associated with the ith stage.

Thus, if there is no fault in the ith stage the fault circuit F is arranged to produce a zero signal on the node 26 and this is connected by way of the inverter 27 to the second input of each of the AND gates 22 and 24. There is thus a one on the second input of each AND gate, and so the output of each AND gate will copy the signal fed to its first input and this is determined by the control circuit 12. That is, if the control circuit puts a one signal on the first input of either AND gate it will produce a one at its output to render any of the switches 15,17,19,21 to which the one is applied conductive. Similarly, a zero signal on the first input of either AND gate 22, 24 will produce a zero at the output of the gate, effective to switch off those of the switches 15,17,19 and 21 connected to be controlled by that AND gate.

If the ith stage is faulty, the fault circuit F is set to produce a one signal at the node 26. This one is inverted, and the resultant zero applied to the second input of each of the AND gates 22 and 24 ensures that a zero appears at the output of each of the AND gates. The zero output of the AND gate 22 is applied to each of the switches 15 and 17 to open these switches, whilst the switches 19 and 21 are switched off by the zero output of the AND gate 24. These switches remain off whilst there is a zero signal on the second input of each of the AND gates irrespective of the signal applied by the control circuit 12 to the other of the inputs of each AND gate.

The sum and carry lines S and C associated with the ith stage can be considered to be equivalent to the input and output lines Is, Ic, Os, Oc of the circuit of FIG. 2. Thus, the stage can be bypassed by a plurality of bypass lines B each associated with a respective one of the sum lines S(0), S(1) to S(35) of the stage, and by a plurality of bypass lines P each arranged to short a respective one of the carry lines C(0), C(1) to C(34). Each of the bypass lines B includes a respective switch 28, each of the bypass lines P includes a respective switch 29, and each of the switches 28 and 29 is connected to be controlled by the signal at the node 26.

It will be seen that when the signal at node 26 is zero, indicating that there is no fault in the ith stage, a zero signal is applied to each of the switches 28 and 29 which are thereby rendered non conductive such that the bypass lines B and P are all open circuit. The signals on the sum and carry lines S and C are therefore fed to the input of the ith stage or transferred to the following stage under the control of the control circuit 12 and the switches 15,17,19 and 21 as appropriate. However, when a fault in the ith stage is indicated by the presence of a one signal at node 26, the switches 28 and 29 are all rendered conductive such that the bypass lines B and P each provide a short circuit path for the respective sum and carry lines S and C. Thus, the data on the input side of the sum and carry lines is shorted to the output side of the sum and carry lines and data is not fed to the input of the next following stage by the ith stage. The ith stage therefore becomes "transparent" to the data. Because the switches 15,17,19 and 21 are also held off by the one signal at the node 26, these switches act to completely isolate the output of the ith stage from the sum and carry lines S and C.

Figure 4:
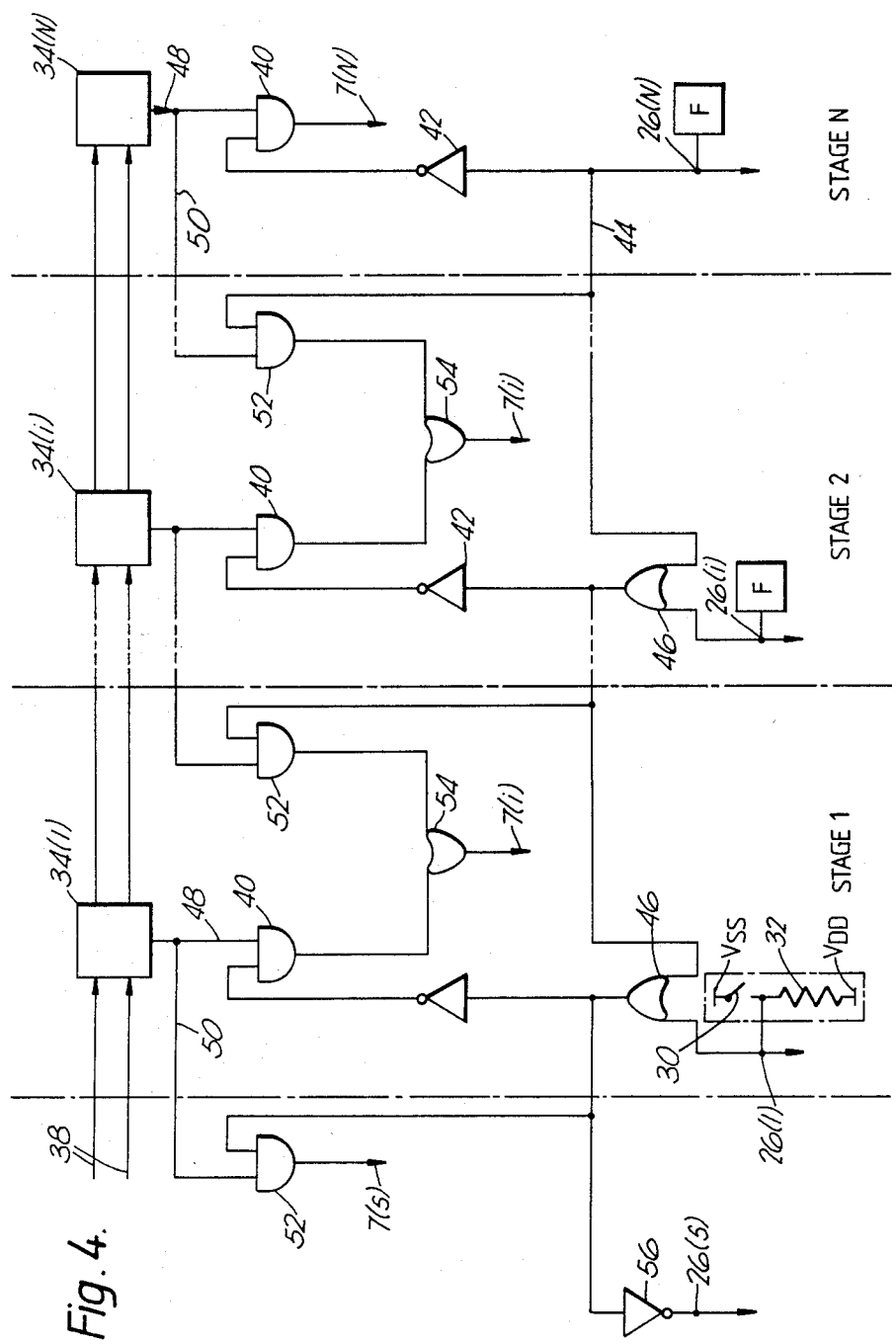
FIG. 4 shows a programmable logic circuit for implementing a redundancy scheme in the circuit of FIG. 1.

The fault indicating circuit F can be implemented in any desired manner. One embodiment is shown in FIG. 4 from which it can be seen that the circuit F comprises a normally closed switch 30, one terminal of which is connected to 0 volts (VSS) of the supply, and the other terminal of which is connected by way of a resistor 32 to the supply voltage (VDD), for example of 5 volts. The switch 30 is programmable and may, for example, be a transistor, a memory location or a fuse. A fuse, for example, a laser fuse, can be blown or not blown during testing of the circuit such that the state of the switch is subsequently frozen.

It has been explained that if a stage of the circuit is found to be faulty is can be bypassed such that data from the preceding stage and any input data fed thereto is applied to the following stage such that the faulty has no effect on the data. However, in the circuit shown in FIG. 1, each stage is arranged to operate not only on common input data from the shift register 2 but also on data specific to that stage fed thereto from the respective coefficient control unit 4(l) to 4(N). Accordingly, if one of the stages is found to be faulty and is bypassed, arrangements must be made to ensure that the data which was to be fed specifically to that faulty stage is still correctly taken into account in the computations performed by the circuit. A logic circuit, which is associated with addressing means for the circuit stages of FIG. 1, and which enables the necessary reordering of the data is shown in FIG. 4.

In order to load the appropriate coefficient into the memory store 5 of the coefficient unit 4 of each stage, a respective address decoder 34(l), 34(i) to 34(N) is associated with each stage. Upon the receipt of the appropriate address on address lines 38, an output 48 of the addressed decoder will go high and a one is connected to the control line 7 associated with the appropriate stage. Thus, when the address of the ith stage is received on address lines 38, the address decoder 34(i) associated with that stage produces a one signal on its output 48 and hence on its control line 7 to cause the memory store 5 of the associated coefficient unit 4 to receive a coefficient from the data path 36. In this manner, the appropriate coefficient is loaded into the memory store 5 and subsequently into the shift register 9 of the ith stage.

The logic circuit indicated in FIG. 4 enables correct loading of the appropriate data into each stage even if one stage has been found to be faulty and has been bypassed. In this respect, the logic circuit is comprised of a number of individual logic stages, each associated with a respective stage of the multi-stage signal processing circuit. It will be seen that a fault indicating circuit F is associated with each stage of the multi-stage circuit.

When the switch 30 of each circuit F is normally closed a zero is put on the output node 26 of the circuit F. If any circuit stage is found to have a fault, its associated switch 30 is opened such that a one signal is put on the output node 26.

The output 48 of the address decoder 34(N) for the last circuit stage N is connected to the first input of an AND 40 whose output is connected to the control line 7(N). The second input of this gate 40 is connected by way of an inverter 42 to the output node 26 of the associated fault circuit F. The logic stage associated with the circuit stage N is also connected to the preceding logic stage which is associated with the preceding circuit stage. Thus, the output node 26 of the circuit F of the Nth stage is connected by way of a lead 44 to the first input of an OR gate 46 in the preceding logic stage, and similarly the output 48 of the address decoder 34(N) is connected by way of a lead 50 to one input of a further AND gate 52 in the preceding logic stage.

The logic stages associated with the circuit stages 1 to N−1 are substantially identical and each comprise a respective first AND gate 40 for connecting the output 48 of the address decoder 34 of the same stage to one input of an OR gate 54, and a respective second AND gate 52 for connecting the output of the address decoder of the next following circuit stage to the second input of the same OR gate 54. The output of the OR gate 54 is connected to the control line 7 of that same logic stage. We have seen that the first input of the OR gate 46 of each logic stage is connected to the following logic stage. The second input of each OR gate 46 is connected to the output node 26 of the associated fault circuit F. In each logic stage, the output of the OR gate 46 is connected by way of the inverter 42 to the second input of the AND gate 40 of the same logic stage, and directly to the second input of the AND gate 52 of the preceding logic stage.

The logic circuit shown in FIG. 4 also includes an initial logic stage associated with a spare circuit stage (not shown). This spare circuit stage would normally be positioned at the beginning of the chain of FIG. 1, that is to the left of stage 1 as illustrated. This spare stage will be substantially identical to the other circuit stages 1 to N and will therefore include adder circuits 8 and an appropriate coefficient control unit 4 in which data is loaded from the data path 36 under the control of the signal on the control line 7(s). The line 7(s) can be connected by way of an AND gate 52 of the initial logic stage and a lead 50 to the output 48 of the address decoder 34(l) of the adjacent logic stage.

Consider first the operation of the logic circuit of FIG. 4 when none of the circuit stages 1 to N of the circuit of FIG. 1 have been found to be faulty. All of the switches 30 of the fault circuits F are normally closed and the output node 26 of each fault circuit F is at zero. The zero at the node 26 is the last logic stage associated with circuit stage N is inverted by the inverter 42 such that a one is applied to the second input of the AND gate 40 whereby the output of the AND gate 40 copies the signal applied to its first input by the address decoder 34(N). Thus, when the address of the Nth circuit stage appears on the address lines 38 the output 48 will go high and a one signal will appear on the control line 7(N) to laod a coefficient into the associated memory store 5. The zero at the output node 26 is also applied to the second input of the AND gate 52 of the preceding logic stage. This ensures that the output of the further AND gate 52 is zero irrespective of the signal on its first input whereby the output 48 of the address decoder 34(N) is isolated from the control line 7 of the preceding stage.

The zero at the output node 26 of the fault circuit F asociated with the last stage N is also applied to the first input of the OR gate 46 of the preceding stage. The second input of this OR gate 46 is also at zero because there is a zero at the node 26 of the appropriate fault circuit F. Thus, this OR gate 46 produces a zero at its output which is inverted by the inverter 42 such that a one is applied to the second input of the AND gate 40 of its stage. A signal is therefore applied to the control line 7 of this stage which is a copy of the output signal of the associated address decoder. Similarly in all of the logic stages the output 48 of the address decoder for that stage is connected by way of its associated first AND gate 40 to the associated control line 7. In each of these stages the further AND gate 52 isolates the control line of that stage from the address decoder of the following stage. It will also be appreciated that the zero at the output of the OR gate 46 of logic stage 1 is similarly applied to the second input of the AND gate 52 of the initial logic stage such that its control line 7(s) is isolated from the address decoder 34(l).

The zero at the output of the OR gate 46 of logic stage 1 is also connected by way of an inverter 56 to an output node 26(s) associated with the spare circuit stage. The signal on the node 26(s) is arranged to control the spare stage and in this case, where no circuit stage has been found to be faulty, there is a one at the node 26(s) which closes switches 28 and 29 of the spare circuit stage which is thereby bypassed.

Thus, in this situation, addressing each address decoder 34 enables that address decoder to connect its output 48 to its associated control line 7 and hence to the coefficient unit 4 associated with that particular circuit stage.

Now consider the situation in which, on testing, one of the circuits stages 1 to N is found to be faulty. The switch 30 in the fault circuit F associated with the stage is opened. This applied a one signal on the respective output node 26. There will be a zero at all of the other output nodes 26. In all of the logic stages following that indicating a fault, that is, to the right as shown in FIG. 4, the situation will be as described above in that the output 48 of the appropriate address decoder will be connected to the control line 7 associated with the same stage. In the stage indicating a fault, the one at the output node 26 is connected to the second input of the respective OR gate 46 which receives at its first input a zero from the following stage. The output of this OR gate 46 will therefore be one. This one signal is fed directly to the second input of the AND gate 52 of the preceding logic stage to connect the address decoder of this stage with the control line of the preceding stage. The one at the output of the OR gate 46 is also applied by way of the inverter 42 to the second input of the AND gate 40 of the same stage whereby the output of the address decoder associated with the faulty stage is isolated from its control line 7. At the same time, and as described above, the one at the output node 26 of the faulty circuit stage will have switched on the switches 28 and 29 in that circuit stage such that the stage is bypassed. Accordingly, this circuit stage no longer contributes to the computation being performed by the circuit.

The one at the output of the OR gate 46 of the logic stage indicating a fault is applied to the first input of the OR gate 46 of the preceding logic stage such that a one is applied to the inverter 42 and hence a one is applied to the second input of the AND gate 40 of this preceding stage. This isolates the address decoder of this preceding stage from its associated control line 7. In addition, the one output of the OR gate 46 of the preceding stage is also applied to the second input of the further AND gate 52 of the stage preceding this preceding stage. Thus, each address decoder from that associated with the faulty stage is connected to the control line associated with the preceding stage and is isolated from its own associated control line. At the commencement of the chain it will be seen that the one at the output of the OR gate 46 of logic stage 1 is applied to the second input of the AND gate 52 of the initial logic stage such that the first address decoder 34(l) is connected to spare control line 7(s) and hence to the spare stage. In addition, this one is applied by way of the inverter 56 to the output node 26(s) of the initial logic stage which opens switches 28 and 29 of the spare circuit stage such that this spare circuit stage is connected into the chain of stages forming the multi-stage circuit.

Thus, it can be seen that where one circuit stage has been found to be faulty, a circuit of FIG. 4 not only causes that stage to be bypassed and enables the spare circuit stage, but also ensures that without a change in the programming all of the currently operable circuit stages can be individually addressed by the addressing means such that the original computation can still be performed under the control of the control unit and clock circuit.

In the circuit as described above, only one spare circuit stage is provided and thus only one fault circuit stage can be replaced. However, it will be apparent that more than one spare circuit stage could be provided with a consequent increase in the number of faulty stages which can be replaced. The logic circuit shown in FIG. 4 can be amplified quite simply to deal with this situation.

In the circuits described above the spare circuit stage or stages are physically located at the beginning of the chain and this is generally preferred. However, there is no reason why the spare circuit stages should not be inserted intermediate within the chain or at the end thereof. This will depend upon the architecture of the particular chip and upon the connection of the chain to the final adder 10.

In the embodiment described, the spare circuit stage is identical to the other circuit stages and thus, when it is not in use, it is bypassed, opening of its switches 28 and 29 being necessary to bring the spare into the circuit. However, it would be possible, particularly where the spare circuit stage is at the commencement of the chain, to omit the bypass lines B and P and simply to provide switch means which normally connect the inputs to the first stage to ground but which can be switched so as to connect these inputs to the outputs of the spare by means of the signal at the output of the inverter 56 of the initial logic stage.

The invention has been described above with reference to a multi-stage circuit particularly arranged to compute the function f(kT) by a process involving repeated addition. However, the multi-stage circuit shown herein is described simply as an example, the invention having application to other multi-stage circuits.

The present invention provides a technique for introducing redundancy into any apparatus made up of a number of stages, which are preferably identical and include active devices such as data processing elements. The stages are connected to form a chain, and preferably each stage is individually addressable. In the specific example given each stage is individually addressable such that a specific coefficient can be input to each stage. Of course, the invention is equally applicable where the same data is to be fed to more than one stage, and/or when the individual stages are addressed to output data or to control the operation of the stage.

The redundancy technique described herein has the advantage that it is simple to implement and does not complicate the programming of the apparatus. Thus, it is only necessary to include a spare circuit stage and a logic circuit of the type shown in FIG. 4. The logic circuit incorporates a fuse or other fault indicating circuit for each of the normal circuit stages. After manufacture, the apparatus can be tested and any faulty circuit stage isolated by setting the fault indicating circuit F associated therewith. This causes the faulty stage to be bypassed, the spare circuit stage to be connected into the chain, and the addressing means to be automatically reordered such that the faulty stage is not addressed but that the addressing means normally associated with the faulty stage address a different stage. It would be possible to provide for the addressing means of a faulty stage to automatically address the spare circuit stage instead. However, it is preferred that the addressing means associated with a faulty stage should address an adjacent stage, for example the preceding stage as shown above, and that the preceding addressing means should similarly address preceding stages such that a serial or chain connection is set up in which each stage is effectively replaced by the next preceding stage. This concatenation of replacement enables the whole circuit to "look" to the control substantially the same whether or not the spare circuit stage has been used and this enables the program to be run without any change in addresses being necessary. There should also be no increase in the access time to the apparatus.

In the embodiment illustrated, each circuit stage has the same number of inputs to the number of its outputs but the technique can be used where there is a difference in this number. In the embodiments shown, the faulty circuit stage or stages are bypassed, and switches are set to isolate the stage from the rest of the circuit. If required, means could also be provided to prevent operation of any active devices in the bypassed stages, for example, to save energy.

Where it is intended that the circuit be tested after manufacture and the fault switches permanently set, the switches of the fault indicating circuits could be fuses or programmed in ROM. The switches could alternatively be programmed in EPROM or EEPROM. Alternatively, the fault indications could be programmed in volatile memory, it would then be necessary to test the circuit and set the switches before use. It would be possible to arrange that upon initialisation, a self testing program would be performed and the fault switches suitably set. Advantageously, the circuit could be provided with a self testing facility operable during operation such that the circuit becomes failure resistant.

The active devices of each stage of the chain of the apparatus could be signal processing elements, data processing elements, or individual data paths.

What is claimed is:

1. Multistage signal processing apparatus comprising
   (a) a plurality of similar linked processing, stages each including
      (i) a signal processing element,
      (ii) a first signal input to each stage,
      (iii) an addressable second signal input to each stage, and
      (iv) an output from each stage;
   (b) a spare signal processing stage similar to each of said linked processing stages;
   (c) coupling circuitry comprising
      (i) first circuitry coupling said linked processing stages in a serial chain between a chain input terminal and a chain output terminal, said output of each stage being coupled to a said first signal input of an adjacent stage in the chain, said first circuitry also being coupled to said spare signal processing stage for selectively connecting the spare signal processing stage to said serial chain,
      (ii) second circuitry coupled to said first circuitry and to said spare signal processing stage for selectively connecting the spare signal processing stage to said serial chain, and
      (iii) third circuitry coupled between the first signal input and output of each linked processing stage to provide a by-pass for each stage;
   (d) address decoding circuitry coupled to said linked processing stages for addressing selectively said second signal inputs in the chain; and
   (e) logic circuitry coupled to said coupling circuitry and to said address decoding circuitry, said logic circuitry being effective to vary the coupling circuitry to by-pass a selected linked processing stage in said chain, to connect said spare signal processing stage into said chain to form a revised chain, and to alter coupling between the address decoding circuitry and said linked processing stages, whereby said signal inputs are correctly addressed in the revised chain.

2. Multistage signal processing apparatus according to claim 1 wherein said first circuitry includes switching circuitry for each said linked processing stage, said switching circuitry being coupled to said logic circuitry and effective when a selected link processing stage is bypassed to disconnect the selected processing stage from the chain and isolate the output of said selected processing stage from said serial chain.

3. Multistage signal processing apparatus according to claim 2 wherein said third circuitry includes a bypass switch in a bypass circuit in parallel with said first circuitry.

4. Multistage signal processing apparatus according to claim 3 wherein said switching circuitry for each linked processing stage comprises a first switch for connecting said output of the stage to a subsequent stage in the chain and a second switch for coupling said first signal input of the stage to said output of the stage.

5. Multistage signal processing apparatus according to claim 1 wherein said logic circuitry comprises a programmable switch for each of said linked processing stages, said programmable switch being effective to vary said coupling circuitry to by-pass a selected linked processing stage when required.

6. Multistage signal processing apparatus according to claim 5 wherein said programmable switch comprises a fuse.

7. Multistage signal processing apparatus according to claim 1 wherein each said signal processing element comprises an adder.

8. Multistage signal processing apparatus according to claim 7 wherein said first circuitry comprises sum and carry lines providing sum and carry signals between adjacent stages in said chain.

9. Multistage signal processing apparatus according to claim 8 wherein said linked processing stages each comprises a plurality of adders arranged in parallel for processing bit signals of different significance.

10. Multistage signal processing apparatus according to claim 8 wherein said second signal input to each stage is arranged to provide a coefficient for multiplication by a signal supplied to said first signal input of the same stage.

11. Multistage signal processing apparatus according to claim 1 wherein said address decoding circuitry comprises a plurality of decoders, each decoder being linked to a respective one of said linked processing stages, and wherein said logic circuitry includes switches for changing coupling between said decoders and said linked processing stages, whereby when a selected linked processing stage in said chain is by-passed, the deocder for said selected linked processing stage is isolated from said selected stage and coupled to said spare signal processing stage.

12. Multistage signal processing apparatus according to claim 1 wherein said address decoding circuitry comprises a plurality of decoders, each decoder being coupled to a respective one of said linked processing stages, and wherein said logic circuitry includes switches for changing coupling between said decoders and said linked processing stages, so that when a selected link processing stage in said chain is by-passed, the decoder for said selected linked processing stage is isolated from said selected stage and said decoder for the selected stage and the decoders for the linked stages between said selected stage and said spare stage are each coupled with an adjacent processing stage along the chain towards said spare stage.

13. Multistage signal processing apparatus according to claim 12 wherein said logic circuitry includes for each linked processing stage, a first switch for coupling a decoder to that stage and a second switch operable to connect said decoder to an adjacent stage.

14. Multistage signalling processing apparatus according to claim 1 wherein said spare signal processing stage is located at one end of said serial chain.

15. A method of processing data in a sequential chain of serially connected processing stages each having a processing element, said method comprising providing a first signal input to each processing stage, addressing each processing stage and providing a respective second signal input to each processing stage, generating an output for each processing stage dependent on said first and second inputs for that stage and connecting said output of each stage in the chain to said first input of the next processing stage in said chain; and, in response to detection of a faulty processing stage, by-passing said stage by providing a direct connection between said first input and the output of said faulty stage, connecting a spare processing stage into said chain to form a revised chain and altering said addressing to address sequentially each processing stage in the revised chain so that said second input signals are supplied to the required processing stages in the revised chain.

16. The method of claim 15 further comprising isolating the output of said faulty stage from said serial chain when said faulty stage is by-passed.

17. The method of claim 15 further comprising generating a respective address signal for each processing stage in said linked chain, and on detection of a faulty processing stage, switching each of said address signals for each stage in the chain between the faulty stage and said spare stage whereby said address signals are allocated sequentially in the revised chain including the spare stage.

18. The method of claim 15 wherein said processing in each processing stage comprises a sequence of adding operations.

19. The method according to claim 18 wherein said second input to each stage comprises a coefficient for multiplication by said first input signal to each stage.

20. The method of claim 18 wherein each said first input comprises both sum and carry signals and each said output comprises sum and carry signals.

21. The method of claim 18 wherein each processing stage comprises processing in parallel a plurality of signal bits of different significance.

22. The method of claim 16 further comprising generating a respective address signal for each processing stage in said linked chain, and, on detection of a faulty processing stage, switching each of said address signals for each stage in the chain between the faulty stage and said spare stage whereby said address signals are allocated sequentially in the revised chain including the spare stage.

* * * * *

UNITED STATES PATENT AND TRADEMARK OFFICE
CERTIFICATE OF CORRECTION

PATENT NO. : 4,858,233

DATED : August 15, 1989

INVENTOR(S) : Dyson et al

It is certified that error appears in the above-identified patent and that said Letters Patent is hereby corrected as shown below:

Column 8, line 45: Delete "laod", and insert --load--

Column 9, line 22: Delete "applied", and insert --applies--

Column 10, line 14: Delete "fault", and insert --faulty--

Claim 9, line 2: Delete "8", and insert --7--

Claim 10, line 2: Delete "8", and insert --7--

Signed and Sealed this

Twelfth Day of June, 1990

Attest:

HARRY F. MANBECK, JR.

*Attesting Officer*  *Commissioner of Patents and Trademarks*